United States Patent
Wang et al.

(10) Patent No.: US 9,620,739 B2
(45) Date of Patent: Apr. 11, 2017

(54) OLED DISPLAY PANEL AND PACKAGING METHOD THEREOF, AND OLED DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jing Wang, Beijing (CN); Ying Zhang, Beijing (CN); Yang Pei, Beijing (CN); Jinbo Ding, Beijing (CN); Xin Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/767,975

(22) PCT Filed: Jan. 7, 2015

(86) PCT No.: PCT/CN2015/070281
§ 371 (c)(1),
(2) Date: Aug. 14, 2015

(87) PCT Pub. No.: WO2016/045250
PCT Pub. Date: Mar. 31, 2016

(65) Prior Publication Data
US 2016/0254491 A1    Sep. 1, 2016

(30) Foreign Application Priority Data
Sep. 22, 2014  (CN) .......................... 2014 1 0486547

(51) Int. Cl.
*H01L 51/52*    (2006.01)
*H01L 51/56*    (2006.01)

(52) U.S. Cl.
CPC ...... *H01L 51/5259* (2013.01); *H01L 51/5246* (2013.01); *H01L 51/56* (2013.01)

(58) Field of Classification Search
CPC ..................... H01L 51/5237–51/5259; H01L 27/32–27/3297
See application file for complete search history.

(56) References Cited

U.S. PATENT DOCUMENTS

2005/0276947 A1    12/2005  Huang et al.
2011/0008593 A1*   1/2011   Abbott, Jr. ................ C03C 8/24
                                                      428/203

(Continued)

FOREIGN PATENT DOCUMENTS

CN    102231427 A    11/2011
CN    102450098 A    5/2012
CN    103681482 A    3/2014

OTHER PUBLICATIONS

Form PCT/ISA/237 issued in International application No. PCT/CN2015/070281 mailed Jun. 29, 2015.

(Continued)

*Primary Examiner* — Mamadou Diallo
(74) *Attorney, Agent, or Firm* — Nath, Goldberg & Meyer; Joshua B. Goldberg

(57) ABSTRACT

An OLED display panel, a packaging method thereof, and an OLED display device are provided. The OLED display panel comprises a substrate and a cover plate opposite to the substrate. An OLED device is provided on the substrate. The cover plate is attached onto the substrate so that the OLED device is located between the substrate and the cover plate. A packaging structure is provided between the substrate and the cover plate. The packaging structure surrounds periphery (Continued)

of the OLED device to hermetically package the OLED device in a dry and anti-oxidation manner. The packaging structure provided in periphery of the OLED device between the substrate and the cover plate in the OLED display panel can not only absorb moisture and oxygen well, but also hermetically package the OLED device more tightly, thereby protecting the OLED display panel against erosion of moisture and oxygen and ensuring better hermetical packaging effects.

17 Claims, 2 Drawing Sheets

(56) References Cited

U.S. PATENT DOCUMENTS

| | | | | |
|---|---|---|---|---|
| 2011/0121352 A1* | 5/2011 | Hesse | ................ | H01L 27/301 257/99 |
| 2011/0303941 A1* | 12/2011 | Lee | ................ | H01L 33/486 257/98 |
| 2012/0235959 A1* | 9/2012 | Endisch | ................ | B81C 1/00269 345/204 |
| 2013/0250208 A1* | 9/2013 | Wu | ................ | H01L 51/52 349/61 |
| 2014/0027709 A1* | 1/2014 | Higginson | ................ | H01L 23/3171 257/13 |
| 2014/0110685 A1* | 4/2014 | Hong | ................ | C23C 14/042 257/40 |
| 2014/0322827 A1* | 10/2014 | Su | ................ | H01L 51/56 438/3 |
| 2014/0374697 A1* | 12/2014 | Liu | ................ | H01L 51/502 257/13 |
| 2015/0255750 A1* | 9/2015 | Sun | ................ | H01L 51/5259 257/40 |
| 2016/0013440 A1* | 1/2016 | Luo | ................ | H01L 51/5246 257/40 |
| 2016/0020432 A1* | 1/2016 | Yu | ................ | H01L 27/3272 257/40 |

OTHER PUBLICATIONS

Office Action dated Aug. 3, 2016 issued in corresponding Chinese Application No. 201410486547.7.

* cited by examiner

OLED DISPLAY PANEL AND PACKAGING METHOD THEREOF, AND OLED DISPLAY DEVICE

This is a National Phase Application filed under 35 U.S.C. 371 as a national stage of PCT/CN2015/070281 filed on Jan. 7, 2015, an application claiming the benefit to Chinese application No. 201410486547.7 filed on Sep. 22, 2014; the content of each of which is hereby incorporated by reference in its entirety.

FIELD OF THE INVENTION

The present invention relates to the field of display technology, in particular, to an OLED display panel and a packaging method thereof, and an OLED display device.

BACKGROUND OF THE INVENTION

An OLED (Organic Light-Emitting Diode) display is an all-solid and active light-emitting display. The OLED display, due to its advantages of high luminance, high contrast, ultra-thin and ultra-light properties, low power consumption, no view angle restriction, wide range of working temperature, etc., is regarded as a new application technology for the next generation of flat panel displays. The packaging method of the OLED device is a key technology of the OLED display that is different from those of other displays. The OLED device is made of an organic material which will undergo irreversible photooxidation in the presence of moisture and oxygen. In addition, water and oxygen are highly erosive to electrode materials such as aluminum, magnesium, silver, or the like. Hence, the packaging of the OLED device has very high requirements on the permeability of water and oxygen.

An existing OLED device packaging technology is "UV+ rear package cap". As shown in FIG. 1, in this technology, first, a desiccant 7 for absorbing moisture is stuck onto the rear package cap 6, then a UV adhesive 9 is applied onto the circumference of an OLED glass substrate 8, and finally, the rear package cap 6 is aligned and attached to the OLED glass substrate 8, and the adhesive 9 (i.e. UV adhesive) is cured with ultraviolet ray. Though this technology has advantages such as mature technology and low cost of equipment, it has the following disadvantages: poor sealing performance, easy permeation of water and oxygen, and inapplicability to top-emitting OLED displays, flexible OLED displays and large-size OLED displays; and as the desiccant 7 is stuck onto the rear package cap 6, the thickness and volume of the OLED display are increased to some extent.

In order to thin the OLED display and increase the air tightness of package, another existing packaging technology is laser sintering frit packaging technology (Frit). The sealing performance of this method is excellent and much better than that of traditional UV resin. As shown in FIG. 2, a layer of frit with a low softening point, having a width approximately from 1 mm to 2 mm and a thickness approximately from 6 μm to 100 μm, is deposited onto edges of the rear package cap 6 by silk-screen printing. Then, organics in the frit are removed by pre-baking to cure the frit. Then, the frit is heated by laser radiation, to melt the frit and to bond the frit to the OLED glass substrate 8 and the rear package cap 6, in order to form a glass wall 10. However, there are still some problems for this packaging technology. With the radiation onto the frit by laser, the thickness of the glass wall 10, formed after the frit is melted, is gradually increased, so that the energy of the laser is gradually weakened with the increase of incident depth in the glass wall 10, thus, not all frit contained in the glass wall 10 may be melted by laser. This will result in that there are a great number of holes and cracks in the glass wall 10, the holes and the cracks provide channels for permeation of moisture and oxygen into the OLED device 11, and thus the service life of the OLED device 11 is greatly reduced.

SUMMARY OF THE INVENTION

In view of the above technical problems in the prior art, the present invention provides an OLED display panel and a packaging method thereof, and an OLED display device. A packaging structure, arranged in the periphery of an OLED device between a substrate and a cover plate, in the OLED display panel can not only absorb moisture and oxygen well, but also hermetically package the OLED device more tightly, thereby protecting the OLED display panel against erosion of moisture and oxygen and further ensuring better hermetical packaging effects.

The present invention provides an OLED display panel, including a substrate and a cover plate arranged opposite to the substrate, an OLED device being arranged on the substrate, the cover plate being attached onto the substrate so that the OLED device is located between the substrate and the cover plate, wherein a packaging structure is further provided between the substrate and the cover plate, and the packaging structure surrounds periphery of the OLED device to hermetically package the OLED device in a dry and anti-oxidation manner.

Preferably, the packaging structure includes an inner film layer and an outer film layer both surrounding the periphery of the OLED device, the outer film layer is closed annular while the inner film layer is unclosed annular, and the outer film layer surrounds periphery of the inner film layer.

Preferably, the inner film layer is formed by splicing a plurality of folded-line-shaped sub-film layers, and any two adjacent sub-film layers have opposite portions to form an elongated groove between the opposite portions, wherein the opposite portions are not connected to each other, and gaps are formed at both ends of the groove.

Preferably, number of the grooves formed by the plurality of sub-film layers ranges from 10 to 100.

Preferably, there are desiccants and antioxidants filled into the grooves.

Preferably, mixing ratio of the desiccants to the antioxidants ranges from 2:1 to 3:1.

Preferably, the desiccants include silica-gel desiccants, the antioxidants include Fe particles, and the desiccants and the antioxidants are spherical and/or cylindrical particles.

Preferably, size of each of the gaps is greater than that of each of the particles of the desiccants and the antioxidants.

Preferably, the inner film layer and the outer film layer are both arranged on the substrate or the cover plate; or, one of the inner film layer and the outer film layer is arranged on the substrate while the other one is arranged on the cover plate.

Preferably, thickness of the inner film layer is the same as that of the outer film layer, and the thickness of both the inner film layer and the outer film layer is equal to that of the OLED device.

Preferably, the inner film layer and the outer film layer are formed of heat curing glue or UV curing glue.

Preferably, the packaging structure further includes a plurality of compression resistant pads arranged on a side, facing the OLED device, of the cover plate, the plurality of compression resistant pads are distributed uniformly, and number of the compression resistant pads is directly proportional to size of the OLED display panel.

Preferably, each of the compression resistant pads is shaped as a circular truncated cone or column, the bottom surface, having a larger area, of the circular truncated cone is attached to the cover plate, and the top surface, having a smaller area, of the circular truncated cone is directed to the OLED device.

Preferably, thickness of the compression resistant pad is smaller than or equal to difference between distance from the substrate to the cover plate and thickness of the OLED device.

Preferably, the compression resistant pads are formed of polyurethane or polyethylene terephthalate.

The present invention further provides an OLED display device which includes the OLED display panel described above.

The present invention further provides a method for packaging the OLED display panel described above, the packaging method including steps of: forming the packaging structure on the substrate or the cover plate, and then, aligning, fitting and hermetically packaging the substrate with the cover plate through the packaging structure.

Preferably, the step of forming the packaging structure on the substrate or the cover plate includes:

step S1: coating seal agent onto the substrate or the cover plate, by a seal agent dispenser, to form an inner film layer and an outer film layer such that the inner film layer includes a plurality of folded-line-shaped sub-film layers formed by coating, and any two adjacent sub-film layers have opposite portions to form an elongated groove between the opposite portions, wherein the opposite portions are not connected to each other, and gaps are formed at both ends of the groove; and step S2: filling desiccants and antioxidants into the groove.

The present invention has the following beneficial effects. In the OLED display panel provided by the present invention, a packaging structure, arranged in the periphery of the OLED device between the substrate and the cover plate, can not only absorb moisture and oxygen well, but also hermetically package the OLED device more tightly, thereby protecting the OLED display panel against erosion of moisture and oxygen, further ensuring better hermetical packaging effects, and further prolonging the service life of the OLED display panel.

In the OLED display device provided by the present invention, by employing the OLED display panel described above, the quality of packaging of the OLED display device is improved, and meanwhile, the service life of the OLED display device is also prolonged.

REFERENCE NUMERALS

1: substrate; 11: OLED device; 2: cover plate; 3: inner film layer; 31: sub-film layer; 32: groove; 33: gap; 12: desiccant and antioxidant; 4: outer film layer; 5: compression resistant pad; 6: rear package cap; 7: desiccant; 8: OLED glass substrate; 9: UV adhesive; 10: glass wall.

DESCRIPTION OF THE PREFERRED EMBODIMENTS

In order to make those skilled in the art understand the technical solutions of the present invention better, an OLED display panel and a packaging method thereof, and an OLED display device, provided by the present invention, will be further described below in detail with reference to accompanying drawings and specific implementations.

First Embodiment

Figure 1:
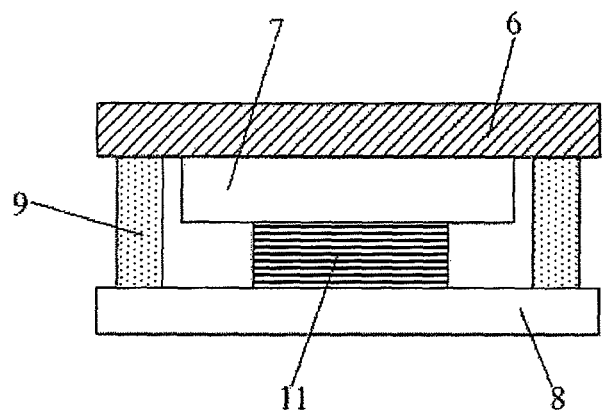
FIG. 1 is a sectional view of a packaging structure of an OLED device in the prior art.
Figure 2:
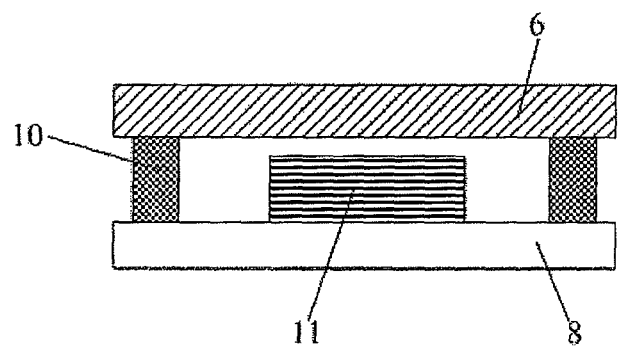
FIG. 2 is a sectional view of another packaging structure of the OLED device in the prior art.
Figure 3:
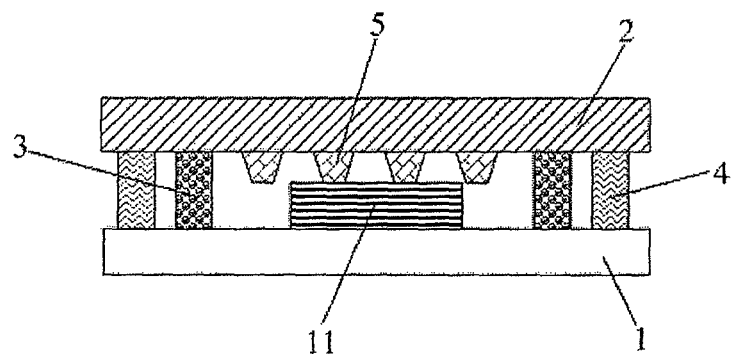
FIG. 3 is a sectional view of an OLED display panel according to a first embodiment of the present invention.
Figure 4:
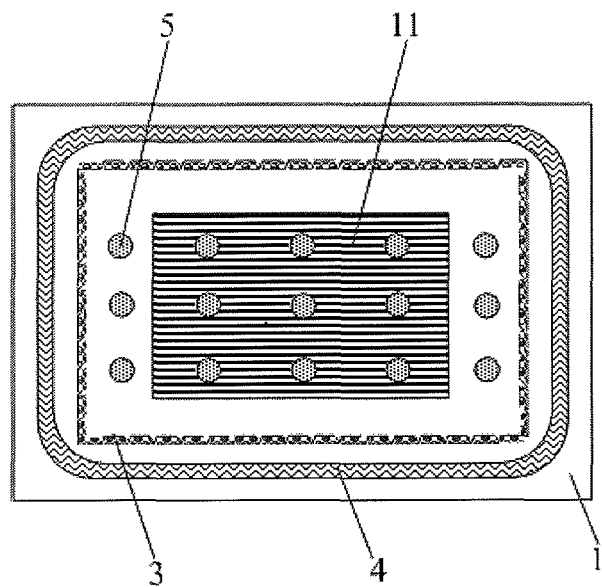
FIG. 4 is a top view of the OLED display panel in FIG. 3 with a cover plate removed.

This embodiment provides an OLED display panel, as shown in FIGS. 3 and 4, including a substrate 1 and a cover plate 2 arranged opposite to the substrate 1. An OLED device 11 is arranged on the substrate 1. The cover plate 2 is attached onto the substrate 1 so that the OLED device 11 is located between the substrate 1 and the cover plate 2. A packaging structure is further arranged between the substrate 1 and the cover plate 2, and the packaging structure surrounds the periphery of the OLED device 11 to hermetically package the OLED device 11 in a dry and anti-oxidation manner.

This packaging structure may hermetically package the OLED device in a dry and anti-oxidation manner to protect the interior of the OLED device 11 against permeation of moisture and oxygen, thereby avoiding damaging the OLED device 11 by moisture and oxygen.

Wherein, the OLED device 11 is an organic light-emitting unit in the OLED display panel. The organic light-emitting unit usually includes an anode, a hole transport layer, a light-emitting layer, an electron transport layer and a cathode, which are stacked successively to form a structure like a sandwich.

In this embodiment, the packaging structure includes an inner film layer 3 and an outer film layer 4 both surrounding the periphery of the OLED device 11, the outer film layer 4 is closed annular while the inner film layer 3 is unclosed annular, and the outer film layer 4 surrounds the periphery of the inner film layer 3.

Figure 5:
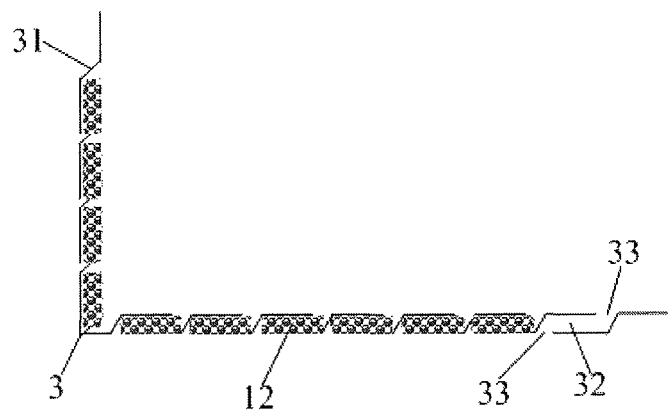
FIG. 5 is a top view of an inner film layer in FIG. 3.

As shown in FIG. 5, the inner film layer 3 is formed by splicing a plurality of folded-line-shaped sub-film layers 31. One of any two adjacent sub-film layers 31 is partially opposite to the other one (i.e. any two adjacent sub-film layers 31 have opposite portions) to form an elongated groove 32 between the two opposite portions. The opposite portions of the two adjacent sub-film layers 31 forming the groove 32 are not connected to each other, and gaps 33 are formed at both ends of the groove 32. That is, the groove 32 is not completely closed. This arrangement makes it convenient to fill desiccants and antioxidants 12 into the groove 32 through the gaps 33 later, to protect the OLED device 11 against permeation of moisture and oxygen, and thus to avoid damaging the OLED device 11 by moisture and oxygen.

The shape of each sub-film layer 31 may be a folded-line shape roughly like a z-shape or a horizontally-reversed z-shape as show in FIG. 5, also may be a wide-sense folded-line shape, having a rounded turn, roughly like an s-shape or a horizontally-reversed s-shape, and also may be other suitable folded-line shapes.

In this embodiment, the number of the grooves 32 formed by the plurality of sub-film layers 31 may range from 10 to 100. Such a number of grooves 32 can ensure the adequate filling of desiccants and antioxidants 12, thus to further ensure the sufficient absorption of moisture and oxygen. The number of the grooves 32 is determined by the coating process of the inner film layer 3. Desiccants and antioxidants 12 are filled into the grooves 32. The desiccants may absorb moisture, and the antioxidants may protect the OLED device 11 against permeation of oxygen and resulting oxidation thereto. Compared with the prior art where the desiccants are arranged on the top of the OLED device 11, the desiccants and antioxidants 12 are filled into the grooves 32 formed by the inner film layer 3, which may save space and thus avoids increasing the thickness and volume of the entire OLED display panel.

As the gaps 33 formed on edges of the groove 32 may allow air to pass through, the desiccants and antioxidants 12, filled into the groove 32, may perform dry and antioxidant effects due to the flow of air through the gaps 33. As the outer film layer 4 is of a closed annular structure, this may ensure the air tightness of packaging of the OLED device 11; and meanwhile, the inner film layer 3 is of an unclosed annular structure (i.e. an open structure) having gaps 33 formed thereon, and the desiccants and antioxidants 12, filled into the grooves 32 defined by the inner film layer 3, may well absorb moisture and has anti-oxidation effect. Hence, such an outer protection and inner absorption way (i.e. the outer film layer 4 prevents the external moisture and oxygen from coming into the OLED device 11 while the inner film layer 3 absorbs moisture and oxygen inside the OLED device 11) effectively protects the OLED device 11 against erosion and oxidation of moisture and oxygen.

Preferably, the mixing ratio of the desiccants to the antioxidants in the desiccants and antioxidants 12 may range from 2:1 to 3:1. As the OLED device 11 is more easily eroded and damaged by the moisture, experiments prove that such a mixing ratio for the desiccants and antioxidants 12 is the optimal one.

In this embodiment, the desiccants include silica-gel desiccants, and the antioxidants include Fe particles. The desiccants and antioxidants 12 are spherical and/or cylindrical particles.

It should be noted that the desiccants are solid, which may be chemical adsorption desiccants or physical adsorption desiccants, such as solid desiccants, transparent desiccants, opaque desiccants, black desiccants, and the like. Fine-pored silica-gel desiccants are optimal, because the silica-gel desiccants will not cause secondary pollution after they absorb moisture. The silica-gel desiccants have a white appearance and exist as a translucent vitreous body, the chemical formula thereof is $mSiO_2 \cdot nH_2O$, and silica-gel desiccants are mainly used for drying and keeping away from moisture. Due to characteristics of high stacking density and obvious moisture absorption effects under low humidity, the silica-gel desiccants may act as an air cleaner and remove moisture in air to control the air humidity. The silica-gel desiccants may be in any shape, including regular or irregular shapes, for example, one or more of spherical and cylindrical shapes; and the size of the silica-gel desiccants may depend on actual requirements.

The antioxidants may be chemical reductants or physical reductants, such as solid reductants. Granular reductants (for example, Fe particles) are better. The antioxidants may realize reduction of oxygen, thereby preventing organic light-emitting material in the OLED device 11 from being negatively influenced by oxygen in air. The shape and size of the antioxidants are the same as those of the desiccants, which will not be repeated here.

In this embodiment, the size of the gaps 33 is greater than that of the particles of the desiccants and antioxidants 12. In this way, the desiccants and antioxidants 12 are ensured to be filled smoothly into the groove 32 through the gaps 33.

It should be understood that, after the desiccants and antioxidants 12 are filled into the groove 32, a net having small holes (the diameter of the holes is smaller than the size of the particles of the desiccants and antioxidants 12) may be used to block the gaps 33 in order to achieve the following two effects: first, preventing the desiccants and antioxidants 12 from going out from the grooves 32 through the gaps 33 to make the inner film layer 3 fail to perform the function of hermetically packaging in a dry and anti-oxidation manner; and second, maintaining the flow of air to achieve dry and anti-oxidation effects of the desiccants and antioxidants 12.

In this embodiment, the inner film layer 3 and the outer film layer 4 are both arranged on the substrate 1.

It should be noted that, the inner film layer 3 and the outer film layer 4 may be both arranged on the cover plate 2; or, the inner film layer 3 is arranged on the substrate 1 while the outer film layer 4 is arranged on the cover plate 2; or, the inner film layer 3 is arranged on the cover plate 2 while the outer film layer 4 is arranged on the substrate 1, as long as the double-layer packaging of the OLED device 11 by the inner film layer 3 and the outer film layer 4 is ensured.

In this embodiment, the thickness of the inner film layer 3 is the same as that of the outer film layer 4, and the thickness of both the inner film layer 3 and the outer film layer 4 is equal to that of the OLED device 11. Wherein, the thickness of both the inner film layer 3 and the outer film layer 4 refers to a perpendicular distance by which the inner film layer 3 and the outer film layer 4 extends from the substrate 1 to the cover plate 2. In this way, the thickness and volume of the OLED display panel may be minimized.

In this embodiment, the inner film layer 3 and the outer film layer 4 are formed of heat curing glue or UV curing glue. The heat curing glue is formed by mixing epoxy resins, catalysts and catalyst solvents, is liquid at normal temperature and becomes solid after heat curing (for approximately 5 minutes at a temperature of 120° C.); and the UV curing glue is formed by mixing acrylic resins and UV initiators, etc, is liquid at normal temperature and becomes solid after UV curing (for approximately 3-5 minutes at a temperature of 120° C.). The heat curing glue or the UV curing glue may stick the substrate 1 and the cover plate 2 together tightly, thereby providing good packaging for the OLED device 11.

Figure 6:
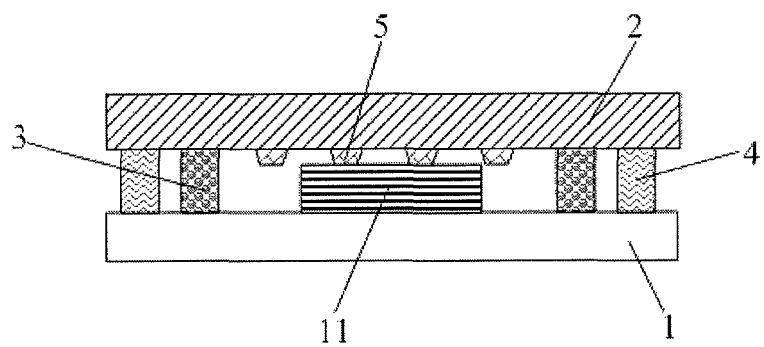
FIG. 6 is a sectional view of the OLED display panel in FIG. 3 deformed due to an external extrusion force.

In this embodiment, the packaging structure further includes a plurality of compression resistant pads 5 arranged on a side, facing the OLED device 11, of the cover plate 2. The plurality of compression resistant pads 5 are distributed uniformly. The number of the compression resistant pads 5 is directly proportional to the size of the OLED display panel. The compression resistant pads 5 are formed of polyurethane or polyethylene terephthalate. The compression resistant pads 5 made of such materials have a low hardness and a high elasticity. As shown in FIG. 6, when the OLED display panel is deformed due to an external extrusion force, the compression resistant pads 5 will have elastic deformation when coming into contact with the OLED device 11, thereby preventing the cover plate 2 from damaging the OLED device 11 when the cover plate 2 is deformed due to a force to come into contact with the OLED device 11.

In this embodiment, each of the compression resistant pads 5 is shaped like a circular truncated cone, the bottom surface, having a larger area, of the circular truncated cone is attached to the cover plate 2, and the top surface, having a smaller area, of the circular truncated cone is directed to the OLED device 11. In this way, the compression resistant pads 5 will not be easily damaged or deformed during resisting compression and also will not damage the OLED device 11. Hence, good compression resistance for the OLED device 11 is ensured.

It should be noted that each of the compression resistant pads 5 may also be shaped like a column such as a cylinder or a prism.

Wherein, the thickness of the compression resistant pad 5 is smaller than or equal to the difference between the distance from the substrate to the cover plate and the thickness of the OLED device 11. In this way, it may be ensured that the compression resistant pads 5 may perform good compression resistance to the OLED device 11 and the OLED display panel will not be damaged during resisting compression, for example, the substrate 1 and the cover plate 2 are separated under pressure. Meanwhile, the setting of the thickness of the compression resistant pad 5 will not increase the thickness of the OLED display panel.

This embodiment further provides a method for packaging the above OLED display panel, including: forming the packaging structure, in the OLED display panel according to the first embodiment of the present invention, on a substrate 1 or a cover plate 2, and then, aligning, fitting and hermetically packaging the substrate 1 with the cover plate 2 through the packaging structure.

In this embodiment, the packaging structure is formed on the substrate 1. The step of forming the packaging structure on the substrate 1 specifically includes:

step S1: coating seal agent onto the substrate 1, by a seal agent dispenser, to form an inner film layer 3 and an outer film layer 4, so that the inner film layer 3 includes a plurality of coated folded-line-shaped sub-film layers 31, and any two adjacent sub-film layers 31 have opposite portions to form an elongated groove 32 between the opposite portions; and the two opposite portions of the two adjacent sub-film layers 31 forming the groove 32 are not connected to each other, and gaps 33 are formed at both ends of the groove 32.

In this step, the outer film layer 4 and the inner film layer 3 are formed by a traditional seal agent coating process. When forming the inner film layer 3, the pattern of the inner film layer 3 coated by the seal agent dispenser is just required to be a plurality of folded-line-shaped lines which are arranged in a loop with heads and tails thereof being not in contact with each other on a plan view. As the width of the folded-line-shaped lines usually ranges from 0.5 mm to 0.6 mm, the folded-line-shaped sub-film layers 31 may be coated completely by the seal agent dispenser.

step S2: Filling desiccants and antioxidants 12 into the groove 32.

In this step, as the top of the groove 32 is open, the desiccants and antioxidants 12 may be filled from the opening on the top of the groove 32 into the groove 32 by mechanical filling equipment (such as a mechanical filling manipulator). In addition, as the two adjacent sub-film layers 31 forming the groove 32 are not connected to each other and gaps 33 are formed at both ends of the groove 32, the desiccants and antioxidants 12 may be filled through the gaps 33 into the groove 32.

After the step S2, a net having small holes (the diameter of the holes is smaller than the size of the particles of the desiccants and antioxidants 12) may be used to block the gaps 33.

In this embodiment, a process of packaging the OLED device 11 is as follows: first, coating the substrate 1 with seal agent to form a plurality of folded-line-shaped sub-film layers 31 in order to form the inner film layer 3 by splicing the plurality of folded-line-shaped sub-film layers 31; next, coating the periphery of the inner film layer 3 with seal agent to form a closed annular outer film layer 4; then, filling desiccants and antioxidants 12 into the groove 32 defined by the inner film layer 3; next, applying a net having small holes (the diameter of the holes is smaller than the size of the particles of the desiccants and antioxidants 12) to block the gaps 33; finally, aligning and fitting the substrate 1 with the cover plate 2, and curing the inner film layer 3 and the outer film layer 4 thus to finish the packaging of the OLED device 11.

The first embodiment has the following beneficial effects: in the OLED display panel provided in the first embodiment, a packaging structure is arranged in the periphery of the OLED device between the substrate and the cover plate, the packaging structure can not only absorb moisture and oxygen well, but also hermetically package the OLED device more tightly, thereby protecting the OLED display panel against erosion of moisture and oxygen, further ensuring better hermetical packaging effects, and further prolonging the service life of the OLED display panel.

Second Embodiment

This embodiment provides an OLED display device including the OLED display panel in the first embodiment.

By employing the OLED display panel in the first embodiment, the quality of packaging of the OLED display device is improved, and meanwhile, the service life of the OLED display device is also prolonged.

It should be understood that, the above embodiments are merely exemplary embodiments used for describing the principle of the present invention, and the present invention is not limited thereto. For a person having ordinary skill in the art, various variations and improvements may be made without departing from the spirit and essence of the present invention, and those variations and improvements should also be regarded as falling into the protection scope of the present invention.

The invention claimed is:

1. An OLED display panel, comprising a substrate and a cover plate provided opposite to the substrate, an OLED device being provided on the substrate, the cover plate being attached onto the substrate so that the OLED device is located between the substrate and the cover plate, wherein a packaging structure is further provided between the substrate and the cover plate, and the packaging structure surrounds periphery of the OLED device to hermetically package the OLED device in a dry and anti-oxidation manner, wherein the packaging structure comprises an inner film layer and an outer film layer both surrounding the periphery of the OLED device, the outer film layer is closed annular while the inner film layer is unclosed annular, and the outer film layer surrounds periphery of the inner film layer.

2. The OLED display panel according to claim 1, wherein the inner film layer is formed by splicing a plurality of folded-line-shaped sub-film layers, and any two adjacent sub-film layers have opposite portions to form an elongated groove between the opposite portions, wherein the opposite portions are not connected to each other, and gaps are formed at both ends of the groove.

3. The OLED display panel according to claim 2, wherein number of the grooves formed by the plurality of sub-film layers ranges from 10 to 100.

4. The OLED display panel according to claim 2, wherein there are desiccants and antioxidants filled into the grooves.

5. The OLED display panel according to claim 4, wherein a mixing ratio of the desiccants to the antioxidants ranges from 2:1 to 3:1.

6. The OLED display panel according to claim 4, wherein the desiccants comprise silica-gel desiccants, the antioxidants comprise Fe particles, and the desiccants and the antioxidants are spherical and/or cylindrical particles.

7. The OLED display panel according to claim 6, wherein a size of each of the gaps is greater than that of each of the particles of the desiccants and the antioxidants.

8. The OLED display panel according to claim 1, wherein the inner film layer and the outer film layer are both arranged on the substrate or the cover plate; or, one of the inner film layer and the outer film layer is arranged on the substrate while the other one is arranged on the cover plate.

9. The OLED display panel according to claim 8, wherein thickness of the inner film layer is the same as that of the outer film layer, and thickness of both the inner film layer and the outer film layer is equal to that of the OLED device.

10. The OLED display panel according to claim 1, wherein the inner film layer and the outer film layer are formed of heat curing glue or UV curing glue.

11. The OLED display panel according to claim 1, wherein the packaging structure further comprises a plurality of compression resistant pads provided on a side, facing the OLED device, of the cover plate, the plurality of compression resistant pads are distributed uniformly, and number of the compression resistant pads is directly proportional to size of the OLED display panel.

12. The OLED display panel according to claim 11, wherein each of the compression resistant pads is shaped as a circular truncated cone or column, the bottom surface, having a larger area, of the circular truncated cone is attached to the cover plate, and the top surface, having a smaller area, of the circular truncated cone is directed to the OLED device.

13. The OLED display panel according to claim 11, wherein thickness of the compression resistant pad is smaller than or equal to difference between distance from the substrate to the cover plate and thickness of the OLED device.

14. The OLED display panel according to claim 11, wherein the compression resistant pads are formed of polyurethane or polyethylene terephthalate.

15. An OLED display device, comprising the OLED display panel according to claim 1.

16. The OLED display device according to claim 15, wherein the inner film layer is formed by splicing a plurality of folded-line-shaped sub-film layers, and any two adjacent sub-film layers have opposite portions to form an elongated groove between the opposite portions, wherein the opposite portions are not connected to each other, and gaps are formed at both ends of the groove.

17. A packaging method of the OLED display panel according to claim 1, comprising steps of: forming the packaging structure on the substrate or the cover plate, and then, aligning, fitting and hermetically packaging the substrate with the cover plate through the packaging structure,
wherein the step of forming the packaging structure on the substrate or the cover plate comprises:
coating seal agent onto the substrate or the cover plate, by a seal agent dispenser, to form the inner film layer and the outer film layer such that the inner film layer comprises a plurality of folded-line-shaped sub-film layers formed by coating, and any two adjacent sub-film layers have opposite portions to form an elongated groove between the opposite portions; wherein the opposite portions are not connected to each other, and gaps are formed at both ends of the groove; and
filling desiccants and antioxidants into the groove.

\* \* \* \* \*